United States Patent
Koike et al.

(10) Patent No.: US 11,117,196 B2
(45) Date of Patent: Sep. 14, 2021

(54) SURFACE-COATED CUTTING TOOL

(71) Applicant: Sumitomo Electric Industries, Ltd., Osaka (JP)

(72) Inventors: Sachiko Koike, Osaka (JP); Yuki Ueda, Osaka (JP); Keiichi Tsuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/615,513

(22) PCT Filed: Mar. 14, 2019

(86) PCT No.: PCT/JP2019/010614
§ 371 (c)(1),
(2) Date: Nov. 21, 2019

(87) PCT Pub. No.: WO2019/181742
PCT Pub. Date: Sep. 26, 2019

(65) Prior Publication Data
US 2020/0114431 A1    Apr. 16, 2020

(30) Foreign Application Priority Data

Mar. 19, 2018    (JP) .............. JP2018-051011

(51) Int. Cl.
*B23B 27/14*    (2006.01)
*B23C 5/16*    (2006.01)
(Continued)

(52) U.S. Cl.
CPC ............. *B23B 27/14* (2013.01); *B23C 5/16* (2013.01); *C23C 28/341* (2013.01);
(Continued)

(58) Field of Classification Search
CPC ............. B23B 27/14; B23B 2228/10; B23B 2228/105; C23C 14/0635; C23C 28/044; B23C 5/16
(Continued)

(56) References Cited

U.S. PATENT DOCUMENTS 5,700,551 A * 12/1997 Kukino ............... C04B 35/5831
428/698

FOREIGN PATENT DOCUMENTS

CN    101497985    *    8/2009
CN    103820761    *    5/2014
(Continued)

OTHER PUBLICATIONS

Raekelboom et al "Structural investigation by Rietveld method of psuttered tungsten carbide thin films" Thin Solid Films 517 p. 1555-1558. (Year: 2009).*
(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a substrate and a coating film that coats the substrate, wherein the coating film includes a $WC_{1-x}$ layer composed of a compound represented by $WC_{1-x}$, where x is more than or equal to 0.54 and less than or equal to 0.58, and the compound represented by $WC_{1-x}$ includes a hexagonal crystal structure.

10 Claims, 2 Drawing Sheets

(51) Int. Cl.
  *C23C 28/00* (2006.01)
  *C23C 28/04* (2006.01)
  *C23C 30/00* (2006.01)
(52) U.S. Cl.
  CPC ..... *B23B 2222/28* (2013.01); *B23B 2228/105* (2013.01); *C23C 28/042* (2013.01); *C23C 28/044* (2013.01); *C23C 30/005* (2013.01)
(58) Field of Classification Search
  USPC .................. 51/307, 309; 428/216, 336, 698
  See application file for complete search history.

(56) References Cited

FOREIGN PATENT DOCUMENTS

| DE | 259003 | * | 8/1988 |
|---|---|---|---|
| EP | 2814999 A | | 8/2013 |
| JP | H06-262405 A | | 9/1994 |

OTHER PUBLICATIONS

Abdelouahdi et al "Microstructural and mechanical investigations of tungsten carbide films deposited by reactive RF sputtering" Surf. & Coat. Techn. 200 p. 6469-6473. (Year: 2006).*

Krzanowski et al "The effects of substrate bias on phase stability and properties of sputter-deposited tungsten carbide" Matt. Lett. 58 p. 3437-3440. (Year: 2004).*

Voevodin et al., "Nanocrystalline WC and WC/a-C composite coatings produced from intersected plasma fluxes at low deposition temperatures," J. Vac. Sci. Technol. A 17(3) May/Jun. 1999, pp. 986-992. [Cited in OA issued in counterpart EP Patent Application dated Jul. 16, 2021].

He et al., "Investigation of Post-deposition Annealing Effects on Microstructure, Mechnical and Tribological Properties of WA/a-c Nanocomposite Coatings," Tribol. Lett (2016) 63:14 [Cited in OA issued in counterpart EP Patent Application dated Jul. 16, 2021].

Kublii et al., "Ordering in the Carbide W2C and Phase Equilibria in the Tungsten—Carbon System in the Region of its Existence," Powder Metallurgy and Metal Ceramics, vol. 43, No. 11-12, 2004, pp. 630-644. [Cited in OA issued in counterpart EP Patentn Application dated Jul. 16, 2021].

Pauleau et al., "Structure and mechnical properties of hard W-C coatings deposited by reactive magnetron sputtering," Surface and Coatings Technology, 54/55 (1992) pp. 324-328. [Cited in OA issued in counterpart EP Patent Application dated Jul. 16, 2021].

* cited by examiner

SURFACE-COATED CUTTING TOOL

TECHNICAL FIELD

The present disclosure relates to a surface-coated cutting tool. The present application claims a priority based on Japanese Patent Application No. 2018-051011 filed on Mar. 19, 2018, the entire content of which is incorporated herein by reference.

BACKGROUND ART

Conventionally, various studies have been conducted in order to achieve a long life of a cutting tool. For example, Japanese Patent Laying-Open No. 06-262405 (Patent Literature 1) discloses a coating component for cutting tools or polishing tools, wherein a coating film containing more than or equal to 30 volume % of cubic tungsten carbide and having a film thickness of 0.5 to 100 μm exists on a surface of a substrate.

CITATION LIST

Patent Literature

PTL 1: Japanese Patent Laying-Open No. 06-262405

SUMMARY OF INVENTION

A surface-coated cutting tool according to the present disclosure is a surface-coated cutting tool including a substrate and a coating film that coats the substrate, wherein the coating film includes a $WC_{1-x}$ layer composed of a compound represented by $WC_{1-x}$, where x is more than or equal to 0.54 and less than or equal to 0.58, and the compound represented by $WC_{1-x}$ includes a hexagonal crystal structure.

DETAILED DESCRIPTION

Figure 1:
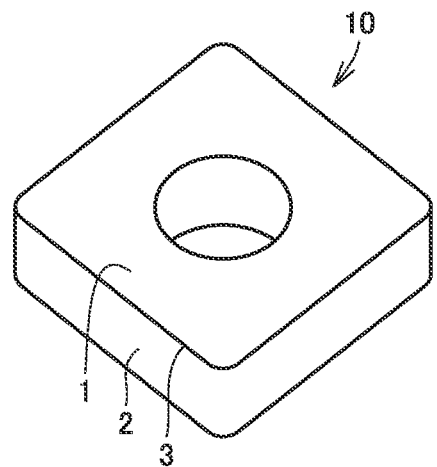
FIG. 1 is a perspective view illustrating one implementation of a surface-coated cutting tool.

Problems to be Solved by the Present Disclosure

In the cutting tool coated with the coating film in Patent Literature 1, metal tungsten remains in the coating film as a by-product. Hence, wear resistance, breakage resistance, and the like are insufficient for high-speed high-efficiency processing. Thus, there is room for improvement.

The present disclosure has been made in view of the above-described circumstance, and has an object to provide a surface-coated cutting tool having excellent breakage resistance.

Advantageous Effect of the Present Disclosure

According to the description above, there can be provided a surface-coated cutting tool having excellent breakage resistance.

Description of Embodiments

[1] A surface-coated cutting tool according to the present disclosure is a surface-coated cutting tool including a substrate and a coating film that coats the substrate, wherein the coating film includes a $WC_{1-x}$ layer composed of a compound represented by $WC_{1-x}$, where x is more than or equal to 0.54 and less than or equal to 0.58, and the compound represented by $WC_{1-x}$ includes a hexagonal crystal structure.

With the above configuration, the surface-coated cutting tool is provided with excellent toughness. As a result, the surface-coated cutting tool has excellent breakage resistance.

[2] The $WC_{1-x}$ layer is in contact with the substrate. By defining in this way, the surface-coated cutting tool has more excellent breakage resistance.

[3] The $WC_{1-x}$ layer includes no free carbon. By defining in this way, the surface-coated cutting tool has more excellent breakage resistance.

[4] The $WC_{1-x}$ layer has a film hardness of more than or equal to 3700 mgf/μm$^2$ and less than or equal to 4500 mgf/μm$^2$. By defining in this way, the surface-coated cutting tool has not only excellent breakage resistance but also excellent wear resistance.

[5] The coating film further includes a hard coating layer formed on the $WC_{1-x}$ layer, the hard coating layer at least includes a first unit layer having a composition different from a composition of the $WC_{1-x}$ layer, and the first unit layer is composed of at least one element selected from a group consisting of a group 4 element, a group 5 element, a group 6 element in a periodic table, Al, and Si, or is composed of a compound composed of at least one of the elements and at least one element selected from a group consisting of carbon, nitrogen, oxygen and boron. By defining in this way, the surface-coated cutting tool has more excellent breakage resistance and excellent wear resistance.

[6] The first unit layer has a thickness of more than or equal to 0.1 μm and less than or equal to 10 μm. By defining in this way, the surface-coated cutting tool has more excellent breakage resistance and excellent wear resistance.

[7] The hard coating layer further includes a second unit layer having a composition different from compositions of the $WC_{1-x}$ layer and the first unit layer, the second unit layer is composed of at least one element selected from a group consisting of a group 4 element, a group 5 element, a group 6 element in the periodic table, Al, and Si, or is composed of a compound composed of at least one of the elements and at least one element selected from a group consisting of carbon, nitrogen, oxygen and boron, and one or a plurality of the first unit layers and one or a plurality of the second unit layers are layered alternately on each other to form a multilayer structure. By defining in this way, the surface-coated cutting tool has more excellent breakage resistance and excellent wear resistance.

[8] When the hard coating layer includes the above-described multilayer structure, the first unit layer has a thickness of more than or equal to 1 nm and less than or equal to 100 nm, and the second unit layer has a thickness of more than or equal to 1 nm and less than or equal to 100 nm. By defining in this way, the surface-coated cutting tool has more excellent breakage resistance and excellent wear resistance.

[9] The coating film has a thickness of more than or equal to 0.1 μm and less than or equal to 10 μm. By defining in this way, the surface-coated cutting tool has more excellent breakage resistance and excellent wear resistance.

[10] The substrate includes at least one selected from a group consisting of a cemented carbide, a cermet, a high-speed steel, a ceramic, a cBN sintered material, and a diamond sintered material. By defining in this way, the surface-coated cutting tool has excellent hardness and strength at a high temperature.

Details of Embodiments of the Present Disclosure

The following describes one embodiment (hereinafter, referred to as "the present embodiment") of the present disclosure. However, the present embodiment is not limited thereto. In the present specification, the expression "A to B" represents a range of lower to upper limits (i.e., more than or equal to A and less than or equal to B). When no unit is indicated for A and a unit is indicated only for B, the unit of A is the same as the unit of B. Further, in the present specification, when a compound is expressed by a chemical formula in which a ratio of composition elements is not limited such as "TiN", it is assumed that the chemical formula includes all the conventionally known composition ratios (elemental ratios). In this case, it is assumed that the above-described chemical formula includes not only a stoichiometric composition but also a non-stoichiometric composition. For example, the chemical formula "TiN" includes not only a stoichiometric composition "$Ti_1N_1$," but also a non-stoichiometric composition such as "$Ti_1N_{0.8}$". The same also applies to compounds other than the "TiN".

<<Surface-Coated Cutting Tool>>

A surface-coated cutting tool according to the present disclosure is a surface-coated cutting tool including a substrate and a coating film that coats the substrate, wherein the coating film includes a $WC_{1-x}$ layer composed of a compound represented by $WC_{1-x}$, where x is more than or equal to 0.54 and less than or equal to 0.58, and the compound represented by $WC_{1-x}$ includes a hexagonal crystal structure.

The surface-coated cutting tool (hereinafter, also simply referred to as "cutting tool") of the present embodiment includes the substrate and the coating film that coats the substrate. Examples of the above-described cutting tool include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

FIG. 1 is a perspective view illustrating one implementation of the surface-coated cutting tool. The surface-coated cutting tool having such a shape is used as an indexable cutting insert, for example. Surface-coated cutting tool 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of surface-coated cutting tool 10. It can be also understood that the shape of such a surface-coated cutting tool 10 corresponds to the shape of the substrate of the surface-coated cutting tool. That is, the substrate has the rake face, the flank face, and the cutting edge ridgeline portion that connects the rake face and the flank face to each other.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

It should be noted that when the cemented carbide is used as the substrate, the effects of the present embodiment are exhibited even if the cemented carbide includes free carbon or an abnormal phase called η phase in the structure thereof. It should be noted that the substrate used in the present embodiment may have a modified surface. For example, in the case of the cemented carbide, β-free layer may be formed on the surface. In the case of the cermet, a surface hardening layer may be formed. Even when the surface is thus modified, the effects of the present embodiment are exhibited.

When the surface-coated cutting tool is an indexable cutting insert (such as an indexable cutting insert for milling), a substrate having a chip breaker or a substrate having no chip breaker may be included. For the shape of the ridgeline portion of the cutting edge, any of the following shapes is included: a sharp edge (ridge at which the rake face and the flank face cross each other); a honing (shape obtained by providing a curvature to the sharp edge); a negative land (chamfered shape); and a shape obtained by combining the honing and the negative land.

<Coating Film>

The "coating film" according to the present embodiment has a function of improving various characteristics in the cutting tool such as breakage resistance, wear resistance, and the like by coating at least a portion (for example, a portion to be brought into contact with a workpiece during cutting) of the substrate. The coating film may coat the entire surface of the substrate. It should be noted that a coating film that does not coat a portion of the substrate and a coating film having a partially different configuration are not deviated from the scope of the present embodiment.

The thickness of the coating film is preferably more than or equal to 0.1 μm and less than or equal to 10 μM, is more preferably more than or equal to 0.3 μm and less than or equal to 10 μm, is further preferably more than or equal to 0.5 μm and less than or equal to 10 μm, is furthermore preferably more than or equal to 1 μm and less than or equal to 6 μm, and is particularly preferably more than or equal to 1.5 μm and less than or equal to 4 μm. If the thickness is less than 0.1 μm, the wear resistance tends to be decreased. If the thickness is more than 10 μm, detachment or breakage of the coating film tends to occur highly frequently when large stress is applied between the coating film and the substrate during intermittent processing. Here, the thickness of the coating film refers to a total of respective thicknesses of layers included in the coating film, such as the below-described $WC_{1-x}$ layer, hard coating layer, and foundation layer. The thickness of the coating film can be determined, for example, as follows: a transmission electron microscope (TEM) is used to measure thicknesses at three arbitrary points in a cross sectional sample parallel to the normal direction of the surface of the substrate, and the average value of the measured thicknesses at the three points is determined. The same applies to respective measurements of the thicknesses of the $WC_{1-x}$ layer, the hard coating layer (first and second unit layers) and the foundation layer, which are described below. Examples of the transmission electron microscope include JEM-2100F (trademark), which is a spherical aberration correction apparatus provided by JEOL.

($WC_{1-x}$ Layer)

The coating film includes the $WC_{1-x}$ layer composed of a compound represented by $WC_{1-x}$. "The compound represented by $WC_{1-x}$" (hereinafter, also referred to as "$WC_{1-x}$") refers to a tungsten carbide in which an elemental ratio of carbon element (C) is 1-x when an elemental ratio of tungsten element (W) is 1. The $WC_{1-x}$ layer may include an inevitable impurity as long as the effects exhibited by the surface-coated cutting tool according to the present embodiment are not compromised. The content ratio of the inevitable impurity is preferably more than or equal to 0 mass % and less than or equal to 0.2 mass % relative to the total mass of the $WC_{1-x}$ layer. The same applies to the below-described "hard coating layer" and "other layers", i.e., an inevitable impurity may be included therein as long as the effects exhibited by the surface-coated cutting tool according to the present embodiment are not compromised.

x is more than or equal to 0.54 and less than or equal to 0.58, is preferably more than or equal to 0.55 and less than or equal to 0.57, and is more preferably more than or equal to 0.56 and less than or equal to 0.569. When x is less than 0.54, free carbon is precipitated at a crystal grain boundary of $WC_{1-x}$, with the result that the strength tends to be decreased. On the other hand, when x is more than 0.58, the strength of the crystal grain boundary tends to be decreased. Accordingly, when x falls out of the above-described range, progress of cracking cannot be suppressed, with the result that the toughness tends to be low. The present inventors presume that such a tendency results from an inappropriate balance between homogeneity and strain of crystals.

x can be determined by obtaining a cross sectional sample, parallel to the normal direction of the surface of the substrate, in the $WC_{1-x}$ layer and by using an energy dispersive X-ray spectroscopy (EDX) apparatus accompanied with a scanning electron microscope (SEM) or TEM to analyze crystal grains in this cross sectional sample. Specifically, the values of x are measured and determined at three arbitrary points of the cross sectional sample in the $WC_{1-x}$ layer, and the average value of the determined values at the three points is regarded as x of the cross sectional sample in the $WC_{1-x}$ layer. Here, it is assumed that for the "three arbitrary points", three arbitrary regions each having a size of 30 nm×30 nm in the $WC_{1-x}$ layer are selected. Examples of the above-described EDX apparatus include JED-2200 (trademark), which is a silicon drift detector provided by JEOL.

The compound represented by $WC_{1-x}$ includes a hexagonal crystal structure. The inclusion of the hexagonal crystal structure in the compound represented by $WC_{1-x}$ can be confirmed by performing X-ray diffraction measurement (XRD measurement) to the above-described three arbitrary points in the $WC_{1-x}$ layer and performing analysis, for example. For example, when the compound represented by $WC_{1-x}$ includes the hexagonal crystal structure, a peak originating from a crystal plane such as a (102) plane is observed in the XRD measurement. Examples of an apparatus used for the X-ray diffraction measurement include: "SmartLab" (trademark) provided by Rigaku; "X'pert" (trademark) provided by PANalytical; and the like.

Figure 2:
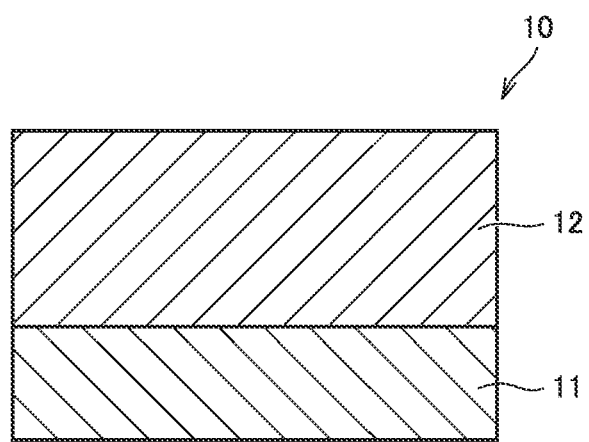
FIG. 2 is a schematic cross sectional view of a surface-coated cutting tool in one implementation of the present embodiment.

FIG. 2 is a schematic cross sectional view of the surface-coated cutting tool in one implementation of the present embodiment. As shown in FIG. 2, $WC_{1-x}$ layer 12 is preferably in contact with substrate 11. In other words, $WC_{1-x}$ layer 12 is preferably provided just above substrate 11.

The $WC_{1-x}$ layer preferably includes no free carbon. Here, the description "includes no free carbon" encompasses not only a case where free carbon is not included at all in the $WC_{1-x}$ layer but also a case where free carbon is less than a detection limit. The term "free carbon" refers to carbon existing as a simple substance without becoming a composition element of $WC_{1-x}$. Examples of the free carbon include a simple substance of carbon including a carbon-carbon double bond, such as graphite or soot. Presence/absence of the free carbon can be confirmed by checking presence/absence of carbon-carbon double bonds at three arbitrary points (presence/absence of C=C peaks in XPS C1s) in the surface of the $WC_{1-x}$ layer using an X-ray photoelectron spectroscopy method (XPS method), for example. Here, when the $WC_{1-x}$ layer is provided at the outermost surface, the measurement is performed after removing a natural oxidation layer by $Ar^+$ sputtering or the like. When the $WC_{1-x}$ layer is not an outermost surface, the measurement is performed after the $WC_{1-x}$ layer is exposed by $Ar^+$ sputtering or the like. Examples of an apparatus used for the XPS method include Versa Probe III (trademark) provided by ULVAC-PHI.

The film hardness of the $WC_{1-x}$ layer is preferably more than or equal to 3700 $mgf/\mu m^2$ and less than or equal to 4500 $mgf/\mu m^2$, and is more preferably more than or equal to 3800 $mgf/\mu m^2$ and less than or equal to 4300 $mgf/\mu m^2$. The film hardness can be measured by a nano indenter. Specifically, first, film hardnesses are measured and determined at ten arbitrary points in the surface of the above-described $WC_{1-x}$ layer. Then, the average value of the determined film hardnesses at the ten points is regarded as the film hardness of the cross sectional sample in the $WC_{1-x}$ layer. Here, when the $WC_{1-x}$ layer is not an outermost surface, the $WC_{1-x}$ layer is exposed by mechanical polishing or the like before performing the measurement by the nano indenter. Examples of the nano indenter include ENT1100 (trademark) provided by Elionix.

The thickness of the $WC_{1-x}$ layer is preferably more than or equal to 0.3 μm and less than or equal to 7 μm, and is more preferably more than or equal to 0.5 μm and less than or equal to 3 μm.

(Hard Coating Layer)

The coating film preferably further includes the hard coating layer formed on the $WC_{1-x}$ layer. The hard coating layer preferably at least includes a first unit layer having a composition different from that of the $WC_{1-x}$ layer.

Figure 3:
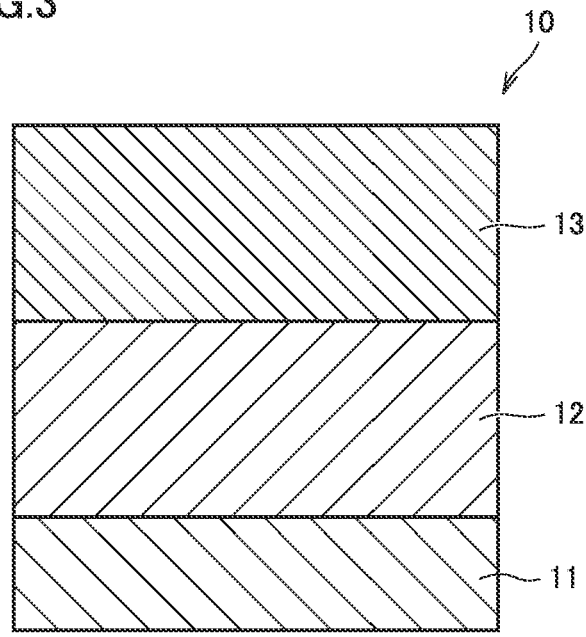
FIG. 3 is a schematic cross sectional view of a surface-coated cutting tool in another implementation of the present embodiment.

Here, regarding the expression "formed on the $WC_{1-x}$ layer", the hard coating layer and the $WC_{1-x}$ layer do not need to be in contact with each other as long as the hard coating layer is provided at the upper side (side further away from the substrate) relative to the $WC_{1-x}$ layer. In other words, another layer may be provided between the $WC_{1-x}$ layer and the hard coating layer. Moreover, as shown in FIG. 3, hard coating layer 13 may be provided just above $WC_{1-x}$ layer 12. The hard coating layer may be an outermost layer (surface layer).

(First Unit Layer)

Preferably, the first unit layer is composed of at least one element selected from a group consisting of a group 4 element, a group 5 element, a group 6 element in a periodic table, Al, and Si, or is composed of a compound composed of at least one of the elements and at least one element selected from a group consisting of carbon, nitrogen, oxygen and boron. More preferably, the first unit layer is composed of at least one element selected from a group consisting of Cr, Al, Ti and Si, or is composed of a compound composed of at least one of the elements and at least one element selected from a group consisting of carbon, nitrogen, oxygen and boron. Examples of the group 4 element in the periodic table include titanium (Ti), zirconium (Zr), hafnium (Hf) and the like. Examples of the group 5 element in the periodic table include vanadium (V), niobium (Nb), tantalum (Ta) and the like. Examples of the group 6 element in the periodic table include chromium (Cr), molybdenum (Mo), tungsten (W) and the like.

Examples of the compound included in the first unit layer include TiAlN, TiAlSiN, TiCrSiN, TiAlCrSiN, AlCrN, AiCrO, AlCrSiN, TiZrN, TiAlMoN, TiAlNbN, TiSiN, AlCrTaN, AlTiVN, TiB$_2$, TiCrHfN, CrSiWN, TiAlCN, TiSiCN, AlZrON, AlCrCN, AlHfN, CrSiBON, TiAlWN, AlCrMoCN, TiAlBN, TiAlCrSiBCNO, ZrN, ZrCN, and the like.

When the hard coating layer is only constituted of the first unit layer (in the case of FIG. 3, for example), the thickness of the first unit layer (i.e., the hard coating layer) is preferably more than or equal to 0.1 μm and less than or equal to 10 μm, and is more preferably more than or equal to 0.5 μm and less than or equal to 7 μm.

(Second Unit Layer)

The hard coating layer preferably further includes a second unit layer having a composition different from those of the WC$_{1-x}$ layer and the first unit layer. Preferably, the second unit layer is composed of at least one element selected from a group consisting of a group 4 element, a group 5 element, a group 6 element in the periodic table, Al, and Si, or is composed of a compound composed of at least one of the elements and at least one element selected from a group consisting of carbon, nitrogen, oxygen and boron. More preferably, the second unit layer is composed of at least one element selected from a group consisting of Cr, Al, Ti and Si, or is composed of a compound composed of at least one of the elements and at least one element selected from a group consisting of carbon, nitrogen, oxygen and boron. Specific examples of the group 4 element, the group 5 element, and the group 6 element in the periodic table include the elements illustrated above.

Examples of the compound included in the second unit layer include: the compounds illustrated above in the above section (First Unit Layer); and the like.

Figure 4:
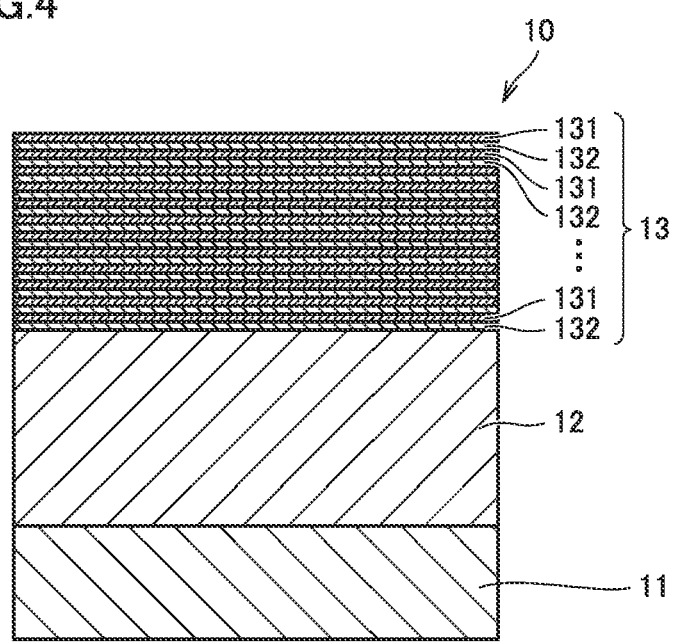
FIG. 4 is a schematic cross sectional view of a surface-coated cutting tool in still another implementation of the present embodiment.

Further, one or a plurality of the first unit layers and one or a plurality of the second unit layers are preferably layered on each other alternately to form a multilayer structure. That is, as shown in FIG. 4, hard coating layer 13 preferably includes a multilayer structure including first unit layers 131 and second unit layers 132. Here, in the multilayer structure, the layering of the first and second unit layers may be started from the first unit layer or the second unit layer. That is, an interface of the multilayer structure at the WC$_{1-x}$ layer side may be constituted of the first unit layer or the second unit layer. Moreover, an interface of the multilayer structure opposite to the WC$_{1-x}$ layer side may be constituted of the first unit layer or the second unit layer.

When the hard coating layer includes the above-described multilayer structure, the thickness of the hard coating layer is preferably more than or equal to 0.1 μm and less than or equal to 10 μm, and is more preferably more than or equal to 0.5 μm and less than or equal to 7 μm.

When the hard coating layer includes the above-described multilayer structure, the thickness of the first unit layer is preferably more than or equal to 1 nm and less than or equal to 100 nm, and is more preferably more than or equal to 2 nm and less than or equal to 25 nm. Further, the thickness of the second unit layer is preferably more than or equal to 1 nm and less than or equal to 100 nm, and is more preferably more than or equal to 2 nm and less than or equal to 25 nm. In one implementation of the present embodiment, when the hard coating layer includes the above-described multilayer structure, it is preferable that the thickness of the first unit layer is more than or equal to 1 nm and less than or equal to 100 nm and the thickness of the second unit layer is more than or equal to 1 nm and less than or equal to 100 nm. Here, the "thickness of the first unit layer" refers to the thickness of one first unit layer. The "thickness of the second unit layer" refers to the thickness of one second unit layer.

Moreover, regarding the number of layers of the multilayer structure, the embodiment encompasses a case where one first unit layer and one second unit layer are layered, and preferably, 20 to 2500 first unit layers and 20 to 2500 second unit layers can be layered, as long as the thickness of the whole of the hard coating layer falls within the above-described range.

(Other Layers)

As long as the effects of the present embodiment are not compromised, the coating film may further include other layers. The other layers may each have a composition different from or the same as the composition of each of the WC$_{1-x}$ layer and the hard coating layer. Examples of the other layers include a TiN layer, a TiWCN layer, and the like. It should be noted that an order of layering these layers is particularly not limited. Examples of the other layers includes: a foundation layer provided between the substrate and the WC$_{1-x}$ layer; an intermediate layer provided between the WC$_{1-x}$ layer and the hard coating layer; an surface layer provided on the hard coating layer; and the like. The thickness of each of the other layers such as the foundation layer is not particularly limited as long as the effects of the present embodiment are not compromised. For example, the thickness of each of the other layers is more than or equal to 0.1 μm and less than or equal to 2 μm.

<<Method for Manufacturing Surface-Coated Cutting Tool>>

A method for manufacturing the surface-coated cutting tool according to the present embodiment includes a substrate preparing step and a WC$_{1-x}$ layer coating step. Hereinafter, each of the steps will be described.

<Substrate Preparing Step>

In the substrate preparing step, the substrate is prepared. As the substrate, any conventionally known substrate for such a purpose of use can be used as described above. For example, when the substrate is composed of a cemented carbide, source material powder, which has a predetermined blending composition (mass %), is first mixed uniformly using a commercially available attritor. Then, this powder mixture is pressed and shaped into a predetermined shape (for example, SEET13T3AGSN, CNMG120408NUX, and the like). Then, in a predetermined sintering furnace, the powder mixture having been pressed and shaped is sintered at 1300 to 1500° C. for 1 to 2 hours, thereby obtaining the substrate composed of the cemented carbide. Moreover, a commercially available product may be used for the substrate without modification. Examples of the commercially available product include EH520 (trademark) provided by Sumitomo Electric Industries HardMetal.

<$WC_{1-x}$ Layer Coating Step>

In the $WC_{1-x}$ layer coating step, at least a portion of the surface of the substrate is coated with the $WC_{1-x}$ layer. Here, the expression "at least a portion of the surface of the substrate" includes a portion to be brought into contact with a workpiece during cutting.

A method for coating at least a portion of the substrate with the $WC_{1-x}$ layer is not limited particularly; however, the $WC_{1-x}$ layer can be formed by a physical vapor deposition method (PVD method), for example.

As the physical vapor deposition method, a conventionally known physical vapor deposition method can be used without a particular limitation. Examples of such a physical vapor deposition method can include a sputtering method, an ion plating method, an arc ion plating method, an electronic ion beam deposition method, and the like. When the cathode arc ion plating method or sputtering method involving a particularly high ionization rate of a material element is used, a metal or gas ion bombardment process can be performed onto the surface of the substrate before forming the coating film. This is preferable because adhesion between the coating film and the substrate is remarkably improved accordingly.

When the $WC_{1-x}$ layer is formed by the arc ion plating method, the following conditions can be employed, for example. That is, first, a WC target (for example, a sintering target or melting target composed of WC and having a C amount of 3 to 6.1 mass %) is set at an arc type evaporation source in an apparatus, a substrate temperature is set to 400 to 550° C., and a gas pressure in the apparatus is set to 1 to 3.5 Pa. As the gas, an argon gas is introduced, for example. Then, while maintaining a substrate (negative) bias voltage to 10 to 700 V and to DC or pulse DC (frequency of 10 to 300 kHz), an arc current of 80 to 150 A is supplied to a cathode electrode, and metal ions and the like are generated from the arc type evaporation source, thereby forming the $WC_{1-x}$ layer. On this occasion, preferably, the substrate temperature is set to 400 to 450° C. at an initial stage of forming the $WC_{1-x}$ layer (the film thickness falls within a range of less than or equal to 0.2 μm), and a bias having a low frequency of 10 to 35 kHz and a bias having a high frequency of 200 to 300 kHz are applied alternately at an interval of 0.5 to 2 minutes. Examples of the apparatus used for the arc ion plating method include AIP (trademark) provided by Kobe Steel.

<Hard Coating Layer Coating Step>

The method for manufacturing the surface-coated cutting tool according to the present embodiment preferably further includes the hard coating layer coating step after the $WC_{1-x}$ layer coating step. The hard coating layer can be formed using a conventional method without a particular limitation. Specifically, for example, the hard coating layer can be formed by the PVD method described above.

<Other Steps>

In addition to the steps described above, in the manufacturing method according to the present embodiment, the following steps may be performed appropriately: a foundation layer coating step of forming the foundation layer between the substrate and the $WC_{1-x}$ layer; an intermediate layer coating step of forming the intermediate layer between the $WC_{1-x}$ layer and the hard coating layer; a surface layer coating step of forming the surface layer on the hard coating layer; a step of performing a surface treatment; and the like. When the above-described other layers such as the foundation layer, the intermediate layer, and the surface layer are formed, the other layers may be formed by a conventional method. Specifically, for example, the other layers may be formed by the PVD method described above. Examples of the step of performing a surface treatment include: a surface treatment using a medium in which diamond powder is carried in an elastic material; and the like. Examples of an apparatus for performing the above-described surface treatment include Sirius Z provided by Fuji Manufacturing, and the like.

Examples

While the present invention will be described in detail with reference to Examples, the present invention is not limited thereto.

<<Production of Surface-Coated Cutting Tool>>

<Substrate Preparing Step>

First, as the substrate preparing step, a JIS K10 carbide (shape: JIS SEET13T3AGSN) was prepared as a substrate. Next, the substrate was set at a predetermined position of an arc ion plating apparatus (trademark: AIP provided by Kobe Steel).

<$WC_{1-x}$ Layer Coating Step>

As the $WC_{1-x}$ layer coating step, a $WC_{1-x}$ layer was formed on the substrate by the arc ion plating method. Specifically, the following method was performed. First, a WC target (sintering target or melting target composed of WC and having a C amount of 3 to 6.1 mass %) was set at an arc type evaporation source of the arc ion plating apparatus. Next, a substrate temperature was set to 400 to 550° C., and a gas pressure in this apparatus was set to 1.0 to 3.5 Pa. As the gas, an argon gas was introduced. Then, while maintaining a substrate (negative) bias voltage to 10 to 700 V and to DC or pulse DC (frequency of 10 to 300 kHz), an arc current of 80 to 150 A was supplied to a cathode electrode. By supplying the arc current, metal ions and the like were generated from the arc type evaporation source, thereby forming the $WC_{1-x}$ layer. Here, the substrate temperature was set to 400 to 450° C. at an initial stage of forming the $WC_{1-x}$ layer (the film thickness falls within a range of less than or equal to 0.2 μm), and a bias having a low frequency of 10 to 35 kHz and a bias having a high frequency of 200 to 300 kHz were applied alternately at an interval of 0.5 to 2 minutes.

<Foundation Layer Coating Step>

For samples (Example 19 and Comparative Example 1) in each of which a foundation layer was provided between the substrate and the $WC_{1-x}$ layer, the foundation layer was formed on the substrate in the following procedure before performing the $WC_{1-x}$ layer coating step. First, a target (sintering target or melting target) including a metal composition in the column of the composition of the foundation layer as described in Table 1 was set at the arc type evaporation source of the arc ion plating apparatus. Next, the substrate temperature was set to 400 to 650° C. and the gas pressure in the apparatus was set to 0.8 to 5 Pa. In the case of a nitride foundation layer, a mixed gas of a nitrogen gas and an argon gas was introduced as a reactive gas. In the case of a carbonitride foundation layer, a mixed gas of a nitrogen gas, a methane gas, and an argon gas was introduced as the reactive gas. Then, an arc current of 80 to 150 A was supplied to the cathode electrode. By supplying the arc current, metal ions and the like are generated from the arc type evaporation source, whereby the foundation layer was formed to have a thickness described in Table 1.

<Hard Coating Layer Coating Step>

Moreover, for samples (Examples 10 to 16 and 18) in each of which a hard coating layer was provided on the $WC_{1-x}$ layer, the hard coating layer was formed on the $WC_{1-x}$ layer in the following procedure after performing the $WC_{1-x}$ layer coating step, thereby producing a surface-coated cutting tool according to the present embodiment. First, a target (sintering target or melting target) including a metal composition in the column of the composition of the hard coating layer as described in Table 1 was set at the arc type evaporation source of the arc ion plating apparatus. Next, the substrate temperature was set to 500 to 650° C. and the gas pressure in the apparatus was set to 0.8 to 5.0 Pa. In the case of a nitride hard coating layer, a mixed gas of a nitrogen gas and an argon gas was introduced as a reactive gas. In the case of a carbonitride hard coating layer, a mixed gas of a nitrogen gas, a methane gas, and an argon gas was introduced as the reactive gas. In the case of an oxide hard coating layer, a mixed gas of an oxygen gas and an argon gas was introduced as the reactive gas. Then, an arc current of 80 to 150 A was supplied to the cathode electrode. By supplying the arc current, metal ions and the like are generated from the arc type evaporation source, whereby the hard coating layer was formed to have a thickness described in Table 1. It should be noted that when forming a hard coating layer having a multilayer structure, respective compositions sequentially described in Table 1 from the left side were repeatedly layered as first and second unit layers until a target thickness was attained.

<<Evaluation on Characteristics of Cutting Tool>>

By using cutting tools of the samples (Examples 1 to 19 and Comparative Examples 1 to 3) produced as described above, characteristics of each of the cutting tools were evaluated as described below.

Composition x of the $WC_{1-x}$ layer was measured, using a cross sectional sample parallel to the normal direction of the surface of the substrate, by an EDX apparatus (trademark: JED-2200, which is a silicon drift detector provided by JEOL) accompanied with a TEM. The measurement was performed under the below-described conditions. Specifically, first, the values of composition x were measured and determined at three arbitrary points of the cross sectional sample in the $WC_{1-x}$ layer. Then, the average value of the determined values at the three points was regarded as composition x of the cross-sectional sample in the $WC_{1-x}$ layer. Here, for the "three arbitrary points", three arbitrary regions each having a size of 30 nm×30 nm in the $WC_{1-x}$ layer were selected. Results thereof are shown in Table 1.

Measurement Conditions in EDX Method

Acceleration voltage: 200 kV

Probe current: 0.29 nA

Probe size: 0.2 nm

A crystal structure of $WC_{1-x}$ in the $WC_{1-x}$ layer was determined through measurement at three arbitrary points in the $WC_{1-x}$ layer using an X-ray diffraction measurement (XRD measurement) apparatus (trademark: X'pert provided by PANalytical). The measurement was performed under below-described conditions. Results thereof are shown in Table 1. In Table 1, the notation "Hexagonal" indicates that hexagonal $WC_{1-x}$ was included and cubic $WC_{1-x}$ was not included. In Table 1, the notation "Hexagonal+Cubic" indicates that the hexagonal $WC_{1-x}$ and the cubic $WC_{1-x}$ were mixed in the $WC_{1-x}$ layer at ratios of 35 mass % and 65 mass % respectively.

Measurement Conditions in XRD Method

Scanning axis: 2θ-θ

X-ray source: Cu-Kα rays (1.541862 Å)

Detector: zero-dimension detector (scintillation counter)

Tube voltage: 45 kV

Tube current: 40 mA

Incoming-light optical system: utilization of a mirror

Light-receiving optical system: utilization of an analyzer crystal (PW3098/27)

Step: 0.03°

Integration time: 2 seconds

Scanning range (2θ): 10° to 120°

Presence/absence of the free carbon in the $WC_{1-x}$ layer was determined by checking presence/absence of carbon-carbon double bonds at three arbitrary points in the surface of the $WC_{1-x}$ layer using an apparatus (trademark: Versa Probe III provided by ULVAC-PHI) used for the XPS method. It should be noted that when the $WC_{1-x}$ layer is provided at the outermost surface, the measurement was performed after removing a natural oxidation layer by $Ar^+$ sputtering or the like. Moreover, when the $WC_{1-x}$ layer was not the outermost surface, the measurement was performed after exposing the $WC_{1-x}$ layer by $Ar^+$ sputtering or the like. Results thereof are shown in Table 1. In Table 1, the notation "Absent" in the column of "Free Carbon" indicates that no free carbon is included in the $WC_{1-x}$ layer, whereas the notation "Present" indicates that free carbon is included in the $WC_{1-x}$ layer.

Measurement Conditions in XPS Method

Used X-ray source: mono-AlKα rays (hv=1486.6 eV)

Detection depth: 1 nm to 10 nm

X-ray beam diameter: about 100 μmφ

Neutralization gun: dual type used $Ar^+$: Acceleration voltage of 4 kV

Raster size: 1×1 mm

Sputtering rate ($Ar^+$): $SiO_2$ sputtering converted value of 28.3 nm/min

The film hardness of the $WC_{1-x}$ layer was measured using a nano indenter (trademark: ENT1100 provided by Elionix) under below-described conditions. On this occasion, the film hardnesses were first measured and determined at ten arbitrary points in the surface of the $WC_{1-x}$ layer. Then, the average value of the determined film hardnesses at the ten points was regarded as the film hardness in the $WC_{1-x}$ layer. It should be noted that when the $WC_{1-x}$ layer was not an outermost surface, the $WC_{1-x}$ layer was exposed by mechanical polishing or the like before performing the measurement by the nano indenter. Results thereof are shown in Table 1.

Measurement Conditions in Nano Indenter

Indenter: Berkovich

Load: 1 gf

Loading time: 10000 msec

Holding time: 2000 msec

Unloading time: 10000 msec

Each of the respective thicknesses of the $WC_{1-x}$ layer, the foundation layer, the hard coating layer (the first and second unit layers), and the coating film was determined as follows. First, a transmission electron microscope (TEM) (trademark: JEM-2100F provided by JEOL) was used to measure thicknesses at three arbitrary points in the cross sectional sample parallel to the normal direction of the surface of the substrate. Then, the average value of the measured thicknesses at the three points was determined. Results thereof are shown in Table 1. The notation "-" in each of the columns "Foundation Layer" and "Hard Coating Layer" in Table 1 indicates that no corresponding layer exists in the coating film. Moreover, a notation such as "TiAlSiN (8 nm)/TiSiN (4 nm) Multilayer Structure (2.0 μm)" in the column "Hard Coating Layer" indicates that the hard coating layer is constituted of a multilayer structure (total thickness of 2.0 μm) in which 167 TiAlSiN layers (first unit layers) each having a thickness of 8 nm and 167 TiSiN layers (second unit layers) each having a thickness of 4 nm are layered alternately on top of each other.

TABLE 1

| | | WC$_{1-x}$ Layer | | | | | |
|---|---|---|---|---|---|---|---|
| Samples | | Composition x | Crystal Structure | Free Carbon | Film Hardness (mgf/μm²) | Foundation Layer | Hard Coating Layer (Surface Layer) | Thickness of Coating Film (μm) |
| Examples | 1 | 0.576 | Hexagonal | Absent | 3650 | — | — | 2.0 |
| | 2 | 0.572 | Hexagonal | Absent | 3790 | — | — | 2.0 |
| | 3 | 0.542 | Hexagonal | Absent | 3900 | — | — | 2.0 |
| | 4 | 0.555 | Hexagonal | Absent | 4410 | — | — | 2.0 |
| | 5 | 0.560 | Hexagonal | Absent | 3850 | — | — | 2.0 |
| | 6 | 0.569 | Hexagonal | Absent | 4260 | — | — | 2.0 |
| | 7 | 0.564 | Hexagonal | Absent | 4200 | — | — | 2.0 |
| | 8 | 0.57 | Hexagonal | Absent | 4500 | — | — | 2.0 |
| | 9 | 0.569 | Hexagonal | Absent | 4260 | — | — | 7.0 |
| | 10 | 0.569 | Hexagonal | Absent | 4260 | — | TiB$_2$ (1.0 μm) | 3.0 |
| | 11 | 0.569 | Hexagonal | Absent | 4260 | — | ZrN (1.0 μm) | 4.0 |
| | 12 | 0.569 | Hexagonal | Absent | 4260 | — | ZrCN (0.5 μm) | 1.5 |
| | 13 | 0.569 | Hexagonal | Absent | 4260 | — | TiAlSiN (8 nm)/TiSiN (4 nm) Multilayer Structure (2.0 μm) | 4.0 |
| | 14 | 0.569 | Hexagonal | Absent | 4260 | — | TiCrSiN (0.6 μm) | 4.0 |
| | 15 | 0.569 | Hexagonal | Absent | 4260 | — | AlCrO (1.1 μm) | 4.0 |
| | 16 | 0.572 | Hexagonal | Absent | 3790 | — | TiAlN (50 nm)/AlCrN (60 nm) Multilayer Structure (4.5 μm) | 9.5 |
| | 17 | 0.572 | Hexagonal | Absent | 3790 | — | — | 0.5 |
| | 18 | 0.572 | Hexagonal | Absent | 3790 | — | TiAlN (50 nm)/AlCrN (60 nm) Multilayer Structure (2.5 μm) | 6.0 |
| | 19 | 0.572 | Hexagonal | Absent | 3650 | TiWCN (0.1 μm) | — | 2.5 |
| Comparative Examples | 1 | 0.610 | Hexagonal | Present | 3600 | TiN (2.0 μm) | — | 4.0 |
| | 2 | 0.508 | Hexagonal + Cubic | Absent | 4400 | — | — | 2.0 |
| | 3 | 0.5 | Hexagonal | Absent | 3300 | — | — | 2.0 |

<<Cutting Test>>

<Breakage Resistance Test>

Under below-described cutting conditions, a cutting time for cutting with the use of each of the cutting tools of the samples (Examples 1 to 19 and Comparative Examples 1 to 3) produced as described above until the cutting tool was broken was measured to evaluate the breakage resistance of the cutting tool. Results thereof are shown in Table 2. It can be evaluated that as the cutting time is longer, the cutting tool has more excellent breakage resistance.

(Cutting Conditions in Breakage Resistance Test (Face Milling Test))

Workpiece (material): Ti-6Al-4V

Speed: V40 m/min

Feed: 0.1 mm/cutting edge

Depths of cut: ad of 4 mm; ae of 10 mm

TABLE 2

| Samples | | Cutting Time until Breakage |
|---|---|---|
| Examples | 1 | 60 Minutes and 9 Seconds |
| | 2 | 63 Minutes and 53 Seconds |
| | 3 | 70 Minutes and 17 Seconds |
| | 4 | 73 Minutes and 57 Seconds |
| | 5 | 87 Minutes and 13 Seconds |
| | 6 | 89 Minutes and 55 Seconds |
| | 7 | 85 Minutes and 44 Seconds |
| | 8 | 73 Minutes and 27 Seconds |
| | 9 | 77 Minutes and 48 Seconds |
| | 10 | 95 Minutes and 24 Seconds |
| | 11 | 97 Minutes and 42 Seconds |
| | 12 | 100 Minutes and 3 Seconds |
| | 13 | 122 Minutes and 55 Seconds |
| | 14 | 105 Minutes and 48 Seconds |
| | 15 | 102 Minutes and 26 Seconds |
| | 16 | 61 Minutes and 14 Seconds |
| | 17 | 51 Minutes and 20 Seconds |
| | 18 | 86 Minutes and 29 Seconds |
| | 19 | 37 Minutes and 3 Seconds |
| Comparative Examples | 1 | 18 Minutes and 18 Seconds |
| | 2 | 22 Minutes and 1 second |
| | 3 | 16 Minutes and 10 Seconds |

In view of the results of the cutting test, it was found that the cutting tools of Examples 1 to 19 have more excellent breakage resistances and longer tool lives than those of the cutting tools of Comparative Examples 1 to 3. This suggested that each of the cutting tools of Examples 1 to 19 is suitable for high-speed high-efficiency processing involving a high load.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: rake face; 2: flank face; 3: cutting edge ridgeline portion; 10: surface-coated cutting tool; 11: substrate; 12: WC$_{1-x}$ layer; 13: hard coating layer; 131: first unit layer; 132: second unit layer.

The invention claimed is:

1. A surface-coated cutting tool comprising a substrate and a coating film that coats the substrate, wherein
the coating film includes a WC$_{1-x}$ layer composed of a compound represented by WC$_{1-x}$, where x is more than or equal to 0.54 and less than or equal to 0.58, and
the compound represented by WC$_{1-x}$ includes a hexagonal crystal structure.

2. The surface-coated cutting tool according to claim 1, wherein the $WC_{1-x}$ layer is in contact with the substrate.

3. The surface-coated cutting tool according to claim 1, wherein the $WC_{1-x}$ layer includes no free carbon.

4. The surface-coated cutting tool according to claim 1, wherein the $WC_{1-x}$ layer has a film hardness of more than or equal to 3700 mgf/μm² and less than or equal to 4500 mgf/μm².

5. The surface-coated cutting tool according to claim 1, wherein
the coating film further includes a hard coating layer formed on the $WC_{1-x}$ layer,
the hard coating layer at least includes a first unit layer having a composition different from a composition of the $WC_{1-x}$ layer, and
the first unit layer is composed of at least one element selected from a group consisting of a group 4 element, a group 5 element, a group 6 element in a periodic table, Al, and Si, or is composed of a compound composed of at least one of the elements and at least one element selected from a group consisting of carbon, nitrogen, oxygen and boron.

6. The surface-coated cutting tool according to claim 5, wherein the first unit layer has a thickness of more than or equal to 0.1 μm and less than or equal to 10 μm.

7. The surface-coated cutting tool according to claim 5, wherein
the hard coating layer further includes a second unit layer having a composition different from compositions of the $WC_{1-x}$ layer and the first unit layer,
the second unit layer is composed of at least one element selected from a group consisting of a group 4 element, a group 5 element, a group 6 element in the periodic table, Al, and Si, or is composed of a compound composed of at least one of the elements and at least one element selected from a group consisting of carbon, nitrogen, oxygen and boron, and
one or a plurality of the first unit layers and one or a plurality of the second unit layers are layered alternately on each other to form a multilayer structure.

8. The surface-coated cutting tool according to claim 7, wherein the first unit layer has a thickness of more than or equal to 1 nm and less than or equal to 100 nm, and the second unit layer has a thickness of more than or equal to 1 nm and less than or equal to 100 nm.

9. The surface-coated cutting tool according to claim 1, wherein the coating film has a thickness of more than or equal to 0.1 μm and less than or equal to 10 μm.

10. The surface-coated cutting tool according to claim 1, wherein the substrate includes at least one selected from a group consisting of a cemented carbide, a cermet, a high-speed steel, a ceramic, a cBN sintered material, and a diamond sintered material.

* * * * *